(12) United States Patent
Tunaboylu et al.

(10) Patent No.: US 7,271,602 B2
(45) Date of Patent: Sep. 18, 2007

(54) PROBE CARD ASSEMBLY AND METHOD OF ATTACHING PROBES TO THE PROBE CARD ASSEMBLY

(75) Inventors: Bahadir Tunaboylu, Gilbert, AZ (US); Habib Kilicaslan, Mesa, AZ (US)

(73) Assignee: SV Probe Pte. Ltd., Singapore (SG)

( * ) Notice: Subject to any disclaimer, the term of this patent is extended or adjusted under 35 U.S.C. 154(b) by 0 days.

(21) Appl. No.: 11/059,246

(22) Filed: Feb. 16, 2005

(65) Prior Publication Data

US 2006/0181292 A1    Aug. 17, 2006

(51) Int. Cl.
*G01R 31/02* (2006.01)

(52) U.S. Cl. .................. 324/754; 324/761; 324/762

(58) Field of Classification Search ............. None
See application file for complete search history.

(56) References Cited

U.S. PATENT DOCUMENTS

| | | | |
|---|---|---|---|
| 5,600,259 A * | 2/1997 | Bartyzel et al. | 324/761 |
| 5,635,846 A * | 6/1997 | Beaman et al. | 324/754 |
| 5,729,148 A | 3/1998 | Sullivan et al. | |
| 6,420,884 B1 * | 7/2002 | Khoury et al. | 324/754 |
| 6,424,164 B1 | 7/2002 | Kister | |
| 6,927,586 B2 * | 8/2005 | Thiessen | 324/754 |
| 6,967,493 B2 * | 11/2005 | Mori et al. | 324/754 |
| 7,047,638 B2 * | 5/2006 | Eldridge et al. | 29/884 |
| 2002/0195265 A1 * | 12/2002 | Miller et al. | 174/70 R |
| 2003/0099097 A1 | 5/2003 | Mok et al. | |
| 2003/0132769 A1 * | 7/2003 | Boll et al. | 324/754 |
| 2004/0099641 A1 | 5/2004 | Mathieu et al. | |

OTHER PUBLICATIONS

International Searching Authority, "Notification of Transmittal of the International Search Report and the Written Opinion of the International Searching Authority or the Declaration," PCT/US2006/005139, dated Jun. 26, 2006, 11 pages.
Current Claims, PCT/US2006/005139, 3 pages (attached).

* cited by examiner

*Primary Examiner*—Minh N. Tang
(74) *Attorney, Agent, or Firm*—Hickman Palermo Truong & Becker LLP

(57) ABSTRACT

A probe card assembly is provided. The probe card assembly includes a substrate layer defining a plurality of apertures and a plurality of probes. Each of the probes has a base and a tip. The base of each probe is configured to be at least partially inserted within one of the plurality of apertures.

22 Claims, 6 Drawing Sheets

PROBE CARD ASSEMBLY AND METHOD OF ATTACHING PROBES TO THE PROBE CARD ASSEMBLY

FIELD OF THE INVENTION

The present invention relates to equipment for testing of semiconductor devices such as integrated circuits. More particularly, the present invention relates to a probe card assembly and a method of attaching probe elements to the probe card assembly.

BACKGROUND

In semiconductor integrated circuit manufacturing, it is conventional to test integrated circuits ("IC's") during manufacturing and prior to shipment to ensure proper operation. Wafer testing is a well-known testing technique commonly used in production testing of wafer-mounted semiconductor IC's, wherein a temporary electrical current is established between automatic test equipment (ATE) and each IC mounted on the wafer to demonstrate proper performance of the IC's. Components that may be used in wafer testing include an ATE test board, which is a multilayer printed circuit board that is connected to the ATE, and that transfers the test signals back and forth between the ATE and a probe card assembly. The probe card assembly (or probe card) includes a printed circuit board that generally contains several hundred probe needles (or "probes") positioned to establish electrical contact with a series of connection terminals (or "die contacts") on the IC wafer.

Known probe card assemblies include a probe card available from Kulicke and Soffa, Inc. of Willow Grove, Pa. Such probe cards comprise a printed circuit board, a probe head having a plurality of flexible probes, and a space transformer which electrically connects the probes to the printed circuit board. The space transformer may comprise a multi-layer ceramic substrate, or alternatively, a multi-layer organic substrate.

It is known to mount the probes to a substrate mounting surface of the space transformer using wire bonding or wedge bonding techniques well known to those of ordinary skill in the art of semiconductor manufacturing. Typically, the probes are mounted to electrically conductive, preferably metallic, bonding pads formed on the substrate through conventional plating or etching techniques.

One difficulty in the fabrication of probe cards is that the probes must be precisely positioned on the substrate mounting surface to provide both proper alignment and planarity of the probe tips. Using conventional probe mounting techniques, great care must be exercised to obtain proper alignment and planarity of the probe tips. As such, it would be desirable to provide an improved probe card and associated method of attaching the probes to the probe card which facilitates achieving proper alignment and planarity of the probe tips.

SUMMARY OF THE INVENTION

According to an exemplary embodiment of the present invention, a probe card assembly is provided. The probe card assembly includes a substrate layer defining a plurality of apertures and a plurality of probes. Each of the probes has a base and a tip. The base of each probe is configured to be at least partially inserted within one of the plurality of apertures.

According to another exemplary embodiment of the present invention, a substrate layer configured to be included in a probe card assembly is provided. The substrate layer defines a plurality of apertures, each of the apertures being sized and shaped to receive the base of a probe of the probe card assembly.

According to yet another exemplary embodiment of the present invention, a probe assembly for use in connection with a probe card assembly is provided. The probe assembly includes a plurality of probes for providing electrical circuit paths in connection with the probe card assembly. The probe assembly also includes a strip connected to the plurality of probes.

According to yet another exemplary embodiment of the present invention, a method of assembling a probe card assembly is provided. The method includes providing a substrate layer defining a plurality of apertures, and at least partially inserting a base of each of a plurality of probes into a corresponding one of the plurality of apertures. The method also includes connecting each base to the substrate layer in the vicinity of the corresponding aperture.

According to yet another exemplary embodiment of the present invention, a method of forming a probe assembly including a plurality of probes is provided. The plurality of probes are configured to provide electrical paths in a probe card assembly. The method includes providing a plurality of probes detachably connected to a strip. The method also includes forming a frangible connection at a connection point between each of the plurality of probes and the strip.

According to yet another exemplary embodiment of the present invention, a method of forming a substrate layer is provided. The substrate layer is configured to be included in a probe card assembly. The method includes providing a sheet of a substrate material. The method also includes forming a plurality of apertures in the sheet of substrate material, each of the apertures being configured to receive a portion of a probe of the probe card assembly.

BRIEF DESCRIPTION OF THE DRAWINGS

For the purpose of illustrating the invention, there is shown in the drawings forms of the invention which are presently preferred; it being understood, however, that this invention is not limited to the precise arrangements and instrumentalities shown.

It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE DRAWINGS

Figure 1:
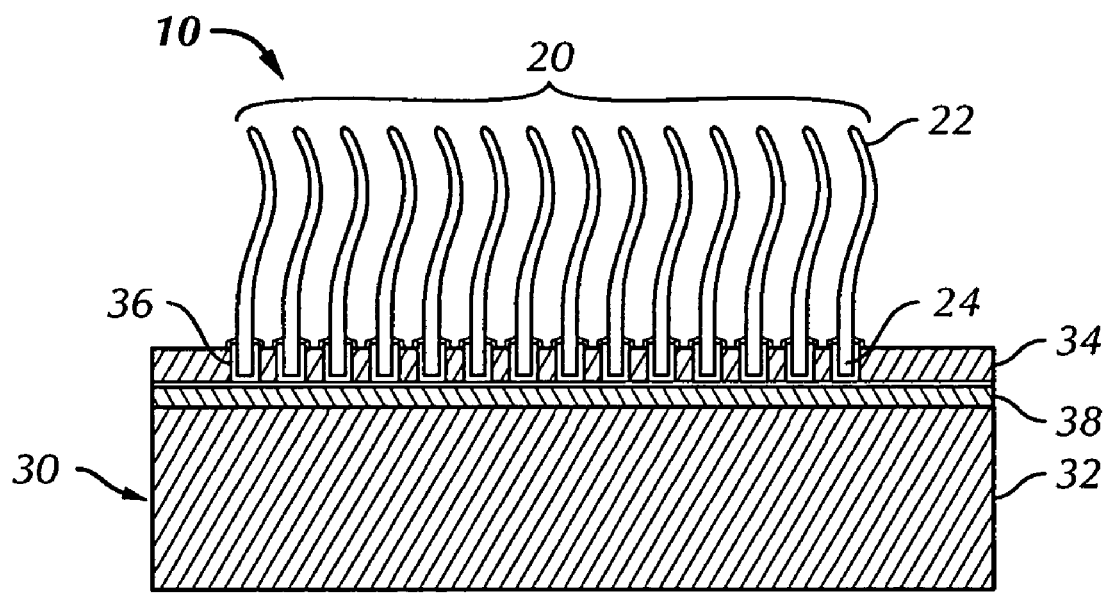
FIG. 1 is side cross-sectional view of a portion of a probe card assembly having a plurality of probes attached to a multilayer ceramic assembly in accordance with an exemplary embodiment of the present invention.
Figure 9:
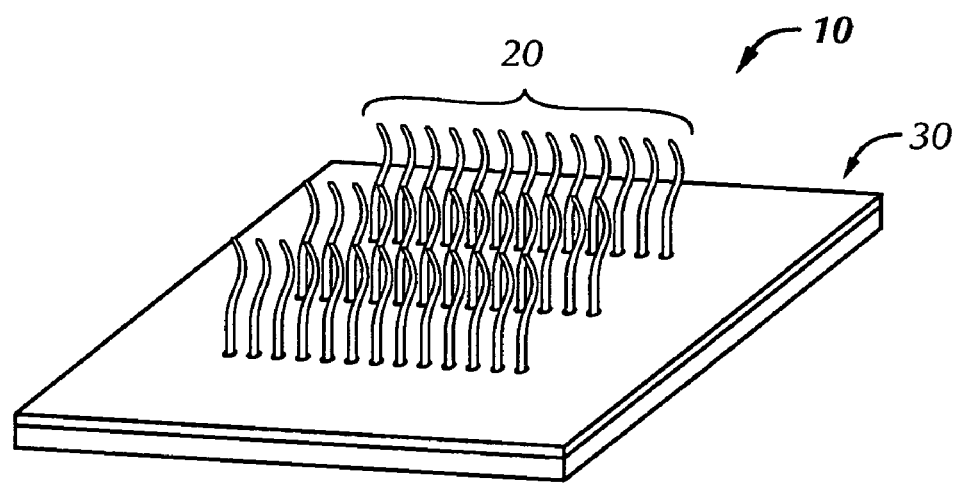
FIG. 9 is a perspective view of the portion of a probe card assembly of FIG. 1.

Referring to the drawings, where like numerals identify like elements, there is illustrated in FIGS. 1 and 9 a portion of a probe card assembly, generally designated by the reference numeral 10, in accordance with an exemplary embodiment of the present invention. The probe card assembly 10 includes a plurality of probes 20 fixedly connected to an assembly 30. In the exemplary embodiment of the present invention illustrated in FIG. 1, assembly 30 is a multi-layered assembly, for example, a multilayered ceramic assembly 30.

Figure 2:
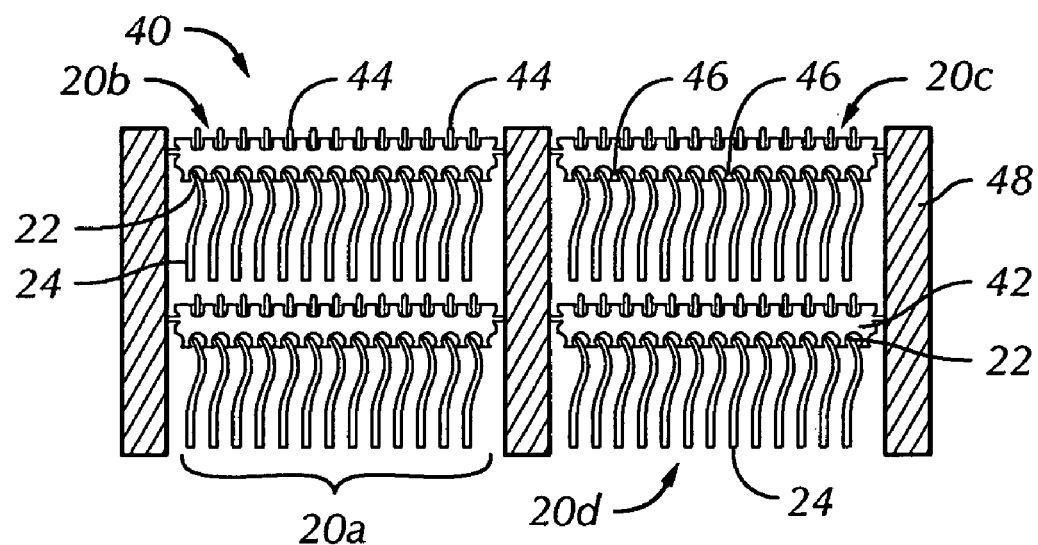
FIG. 2 is a plan view of a probe assembly having multiple sets of probes, shown prior to attachment of the probes to the multilayer ceramic assembly to form the probe card assembly of FIG. 1.
Figure 3:
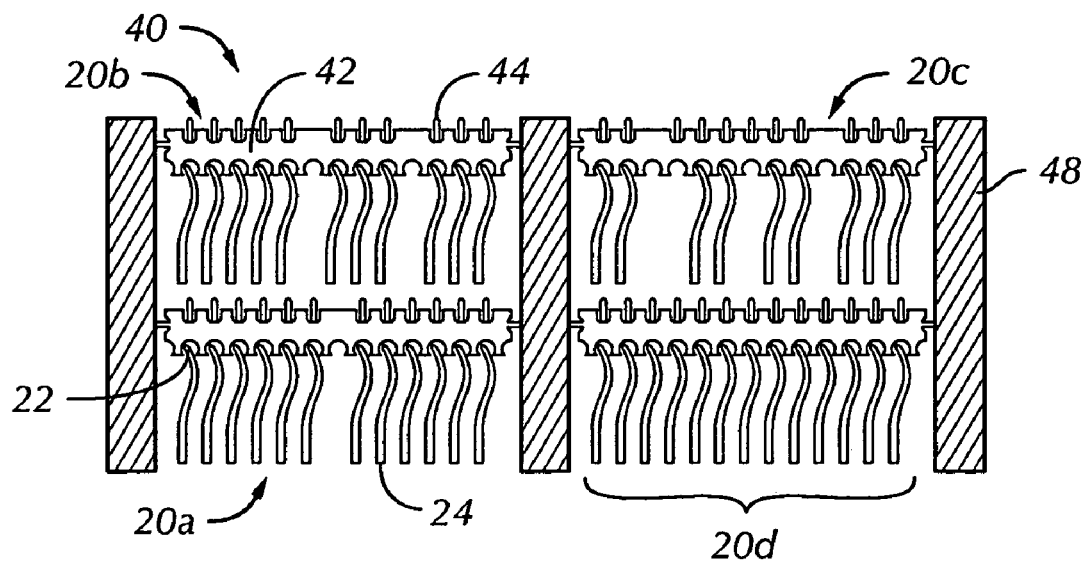
FIG. 3 is a plan view of the probe assembly of FIG. 2, shown with unnecessary probes removed from the probe assembly.

The probes 20 each have a tip 22 and a base 24. In certain exemplary embodiments of the present invention, the probes 20 have a serpentine shape, to increase the flexibility of the probes 20 in a longitudinal direction. With reference to FIG. 2, the plurality of probes 20 are illustrated as being produced through a photolithographic process, electroformed using techniques such as electro-discharge machining, mechanically stamped, or etched using techniques and materials well-known to those of ordinary skill in the art of semiconductor manufacturing. In the exemplary embodiment shown in FIG. 2, multiple sets of the probes 20 are preferably formed simultaneously in a probe assembly 40. The probe assembly 40 illustrated comprises first through fourth sets of probes 20a-20d. Each set of probes 20a-20d includes a continuous strip portion 42. The probes 20 are connected along a first edge of the strip portion 42 by frangible members or sections 46. The probes 20 are preferably connected to the frangible members 46 at or near their tip ends 22, leaving the bases 24 as free ends. A plurality of alignment members 44 are provided along a second edge of the strip portions 42 in the exemplary embodiment illustrated in FIG. 2. The function of the alignment members 44 is described below herein. The sets of probes 20a-20d may be separated by dividers 48. While four sets of probes are shown, it should be readily apparent that the process described herein is not limited to any specific number of probes.

With reference again to FIG. 1, the probe card assembly 10 includes the assembly 30 to which the probes 20 are fixedly connected. The assembly 30 includes a substrate 32 (e.g., a space transformer, such as a multilayer ceramic substrate) and a substrate 34 (e.g., a thin film exterior layer) connected to the substrate 32. Additionally, an intermediate, underlying layer 38 may be provided between the substrate 34 and the substrate 32. For clarity of an exemplary embodiment of the present invention, substrate 32 will be described herein primarily as a multilayer ceramic substrate 32, and substrate 34 will be described primarily as a thin film layer 34 or an exterior layer 34; however, it is to be understood that substrates 32 and 34 are not limited thereto. For example, substrate 32 is not limited to being "multilayered" or "ceramic," and may be any type of substrate or space transformer device such as an organic substrate. Likewise, substrate 34 is not limited to being a thin film layer, and may be any type of substrate appropriate for a given application.

Multilayer ceramic substrates 32 are well known in the art and, thus, no further details on the fabrication or configuration of the multilayer ceramic substrate 32 is necessary.

The exterior layer or substrate 34 has a plurality of vias 36 formed in it at the desired location for the probes, each via defining a conductive via hole. Each via hole 36 is sized and shaped slightly larger than the base 24 of a probe 20. The exterior layer 34 may be a thin-film layer fabricated from a polymer material such as polyimide or liquid crystal polymer layer(s). Alternatively, the exterior layer 34 can be fabricated from a ceramic material. In one preferred embodiment, the exterior layer 34 has a thickness in the range of about 150 µm to about 250 µm. The exterior layer 34 is attached to the remainder of the assembly 30 using conventional techniques, such as a dry film process and laser trimming. Multiple manufacturers are capable of producing the exterior layer 34 using conventional techniques. The vias 36 are formed in the exterior layer 34 using conventional techniques, such as, for example, laser drilling. In certain embodiments of the present invention, the vias 36 are blind holes, and do not extend completely through the exterior layer 34. In other embodiments, the vias 36 do extend through the exterior layer 34, but abut an adjacent layer through which the via does not extend (e.g., underlying/intermediate layer 38, multilayer ceramic substrate 32, etc.).

The intermediate layer 38 may be provided between the multilayer ceramic substrate 32 and exterior layer 34. According to an exemplary embodiment of the present invention, the intermediate layer 38 is formed from three separate layers of a polymer such as polyimide and each separate layer has a thickness in the range of about 22 µm to about 33 µm, and thus the intermediate layer 38 assembly has a total thickness in the range of about 66 µm to about 100 µm. The intermediate layer 38 is used to route signals, power and ground traces or planes. The use of the polyimide exterior and intermediate layers 34, 38 allows for fine pitch probe spacing and large die sizes. However, the present invention is not limited thereto, as the intermediate layer 38 could be fabricated from, for example, ceramic materials.

Figure 4:
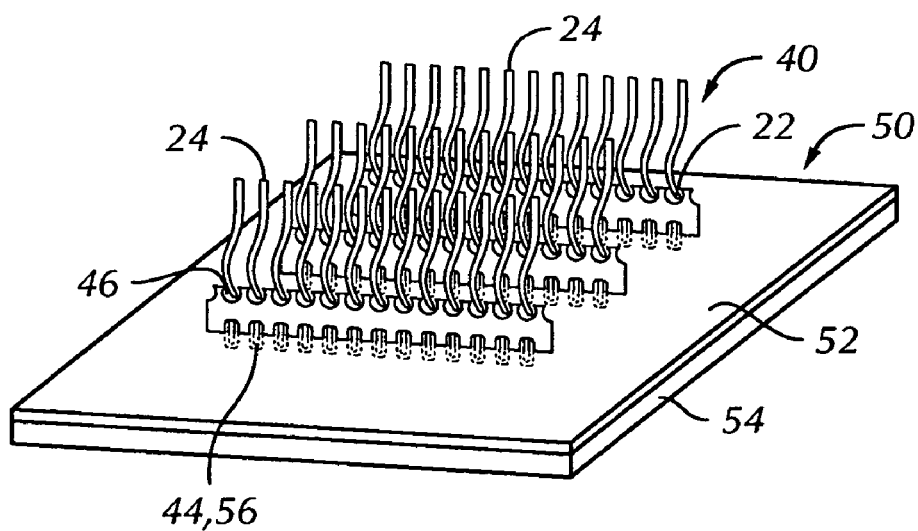
FIG. 4 is a perspective view of multiple sets of probes of the probe assembly of FIG. 3 shown attached to a template in preparation for being transferred to the multilayer ceramic assembly of FIG. 1.
Figure 5:
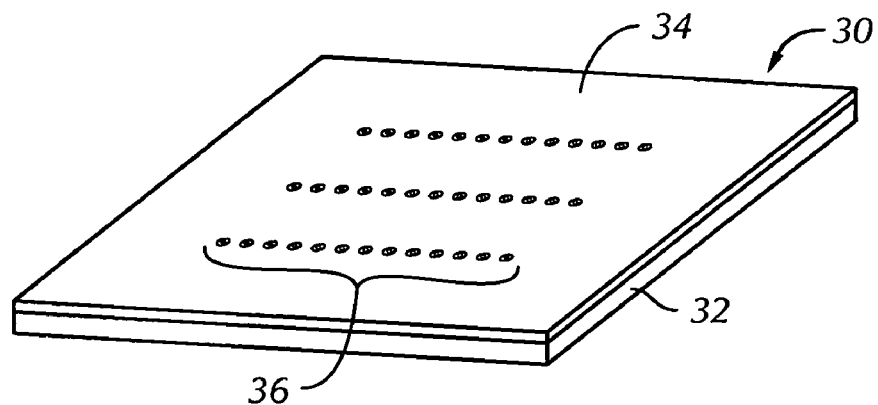
FIG. 5 is a perspective view of the multilayer ceramic assembly of FIG. 1.
Figure 6:
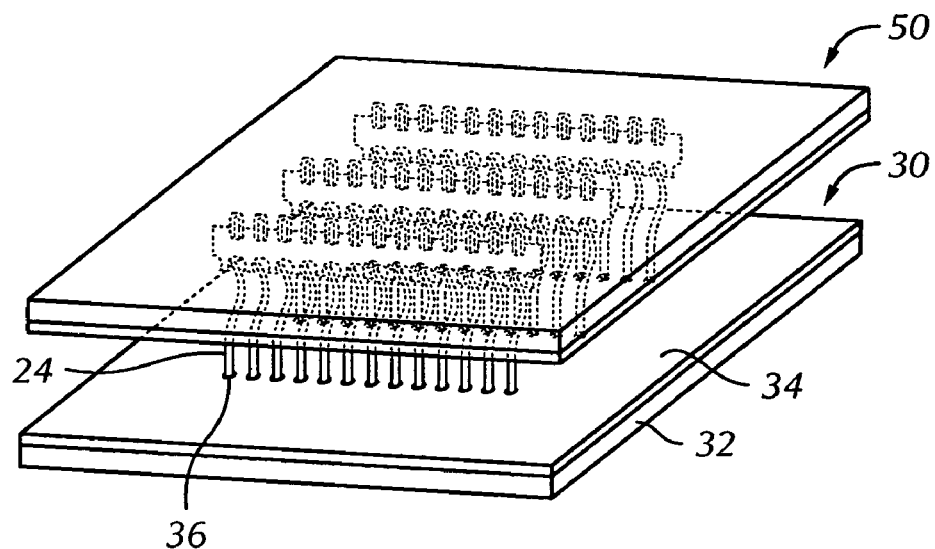
FIG. 6 is a perspective view of the probe and template assembly of FIG. 4 shown in the process of transfer of the probes to the multilayer ceramic assembly of FIG. 5.
Figure 7:
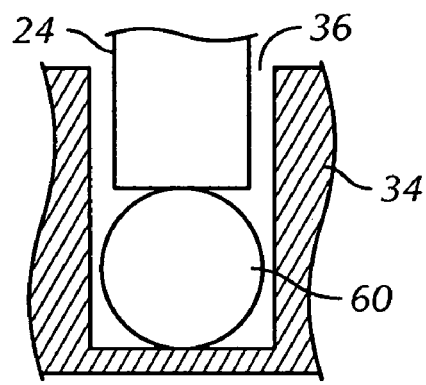
FIG. 7 is an enlarged partial cross-sectional view of a hole formed within an exterior layer of the multilayer ceramic assembly of FIG. 6, showing a predetermined amount of solder deposited within the hole, and showing a base of a probe inserted within the hole.
Figure 8:
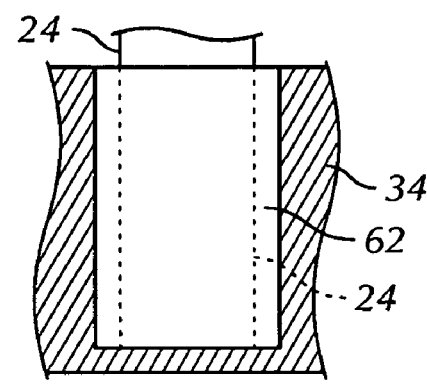
FIG. 8 is an enlarged partial cross-sectional view of the hole of FIG. 7, shown after the solder has been heated, the base of the probe being fully inserted within the hole, and the solder allowed to cool to form a connection between the probe and the exterior layer.

Each probe base 24 is capable of being installed within one of the plurality of via holes 36 and connected to the exterior layer 34. According to an exemplary embodiment of the present invention, the process of installing the probes 20 is performed using a template 50 to transfer and position the plurality of probes 20 into the corresponding plurality of via holes 36. With particular reference to FIG. 4, an exemplary template 50 is an assembly including an exterior layer 52 and a supporting substrate 54. The template exterior layer 52 may be similar to the multilayer ceramic assembly exterior layer 34. The template exterior layer 52 includes a plurality of receptacles 56 positioned in a manner corresponding to the positions of the exterior layer holes 36. The template receptacles 56 are sized and shaped to receive the alignment members 44 (or alternatively, the template may receive the probes directly, with no strips including alignment members). The template exterior layer 52 may be fabricated from, for example, a polymer such as polyimide. The supporting substrate 54 may be fabricated from, for example, a rigid material, such as steel or aluminum.

Figure 10:
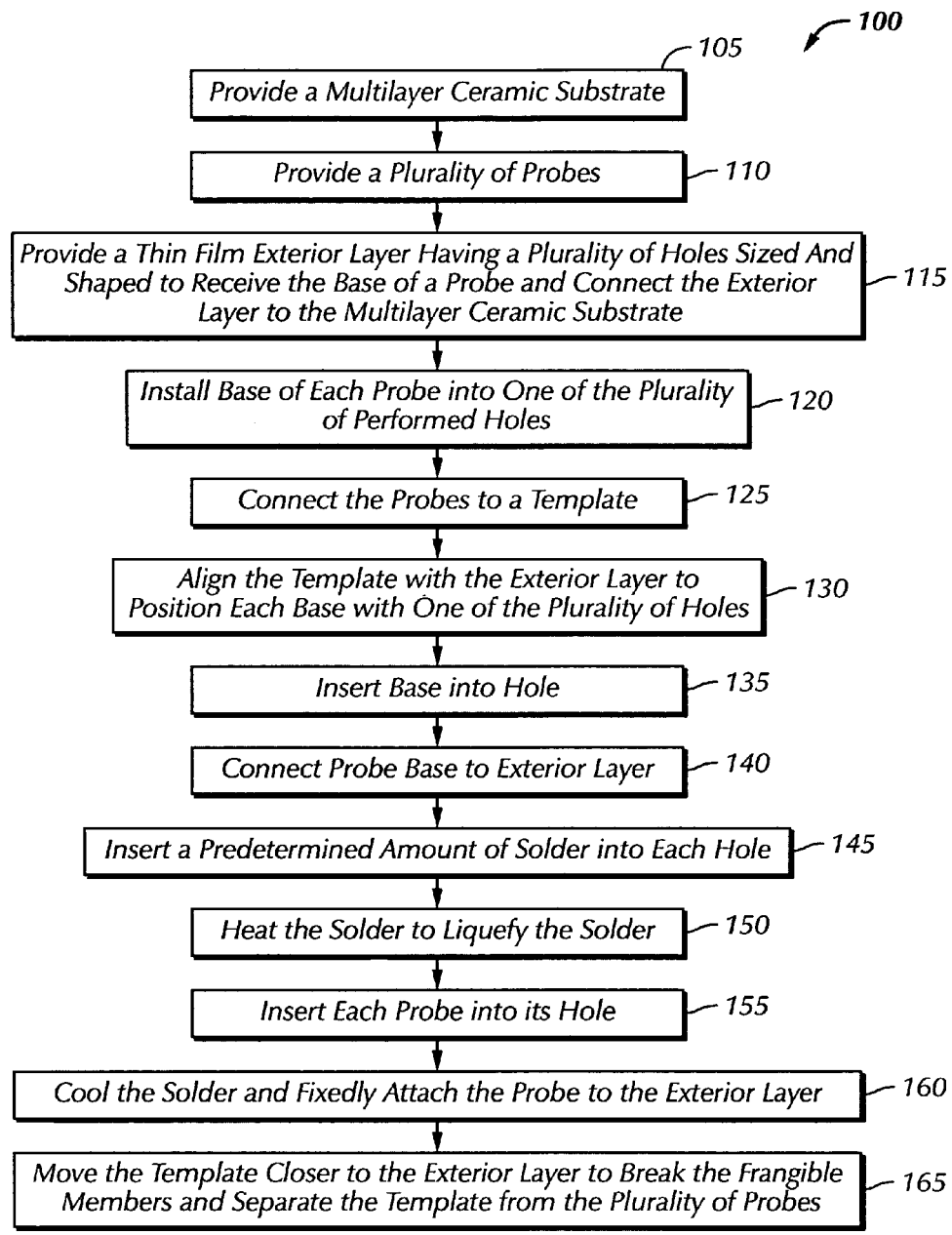
FIG. 10 is a flow diagram illustrating a method of attaching probes to a probe card in accordance with an exemplary embodiment of the present invention.

With reference now to FIGS. 2-10, an exemplary process is shown for attaching the probes 20 to a remainder of the probe card assembly 10 using a method 100 (method 100 is illustrated in the flow diagram of FIG. 10). The method 100 includes a step 105 of providing the multilayer ceramic substrate 32. The plurality of probes 20 are provided (step 110), each probe 20 having base 24 and a tip 22. For example, the plurality of probes 20 are produced by conventional photolithographic, electroforming, or etching techniques, with the probes 20 being connected to the continuous strip 42 by frangible members 46.

The thin film exterior layer 34 is provided and is fixedly connected to the multilayer ceramic substrate 32 (step 115). The exterior layer 34 includes the plurality of preformed holes 36, each hole 36 being sized and shaped to receive the base 24 of one of the plurality of probes 20. The base 24 of each probe 20 is installed into one of the plurality of preformed holes 36 (step 120). For example, installation of the probes 20 into the preformed holes 36 (step 120) is accomplished by: connecting the probes 20 to the template 50 by connecting the continuous strip 42 to the template 50 (step 125); aligning the template 50 with the exterior layer 34 of the multilayer ceramic assembly 30 to position each probe base 24 within one of the plurality of holes 36 (step 130); and inserting each base 24 within a corresponding hole 36 in which the probe base 24 is received (step 135).

Each base 24 is connected to the exterior layer 34 (step 140). For example, connection of the bases 24 to the exterior layer 34 (step 140) is accomplished by inserting a predetermined amount of solder 60 into each hole 36 (e.g., in ball form or another shape) prior to installation of the probe base 24 into the hole 36 (step 145 or step 135), heating the solder 60 to a temperature sufficient to liquefy the solder (step 150), at least partially inserting each probe base 24 into its hole 36 (step 155), and cooling the solder 60 to solidify the solder into a solder connection 62 after the base 24 has been installed into the hole 36 (step 160) to fixedly attach the probe 20 to the multilayer ceramic substrate 32. According to an exemplary embodiment of the present invention, the amount of solder 60 is sufficient to substantially fill the hole 36 when the base 24 is inserted into the hole 36.

Alternatively, rather than inserting a predetermined amount of solder into each hole 36 in ball form, an interior surface of the preformed holes may be plated in solder, and the solder subsequently heated to attach the probes. As a further alternative, solder may be attached to the probe tails or bases 24 prior to insertion of the probes into the preformed holes 36. Thus, it is clear that the present invention contemplates various methods of providing solder for securing the bases 24 to the exterior layer 34. Further still, other conventional methods (other then soldering) are contemplated for conductively coupling the bases 24 to the exterior layer 24.

The method 100 optionally comprises a step 165 of moving the template 50 closer to the exterior layer 34, to flex the plurality of probes 20 and break the frangible connections 46 between the strip 42 and the probes 20, thus separating the template 50 from the plurality of probes 20.

Figure 11:
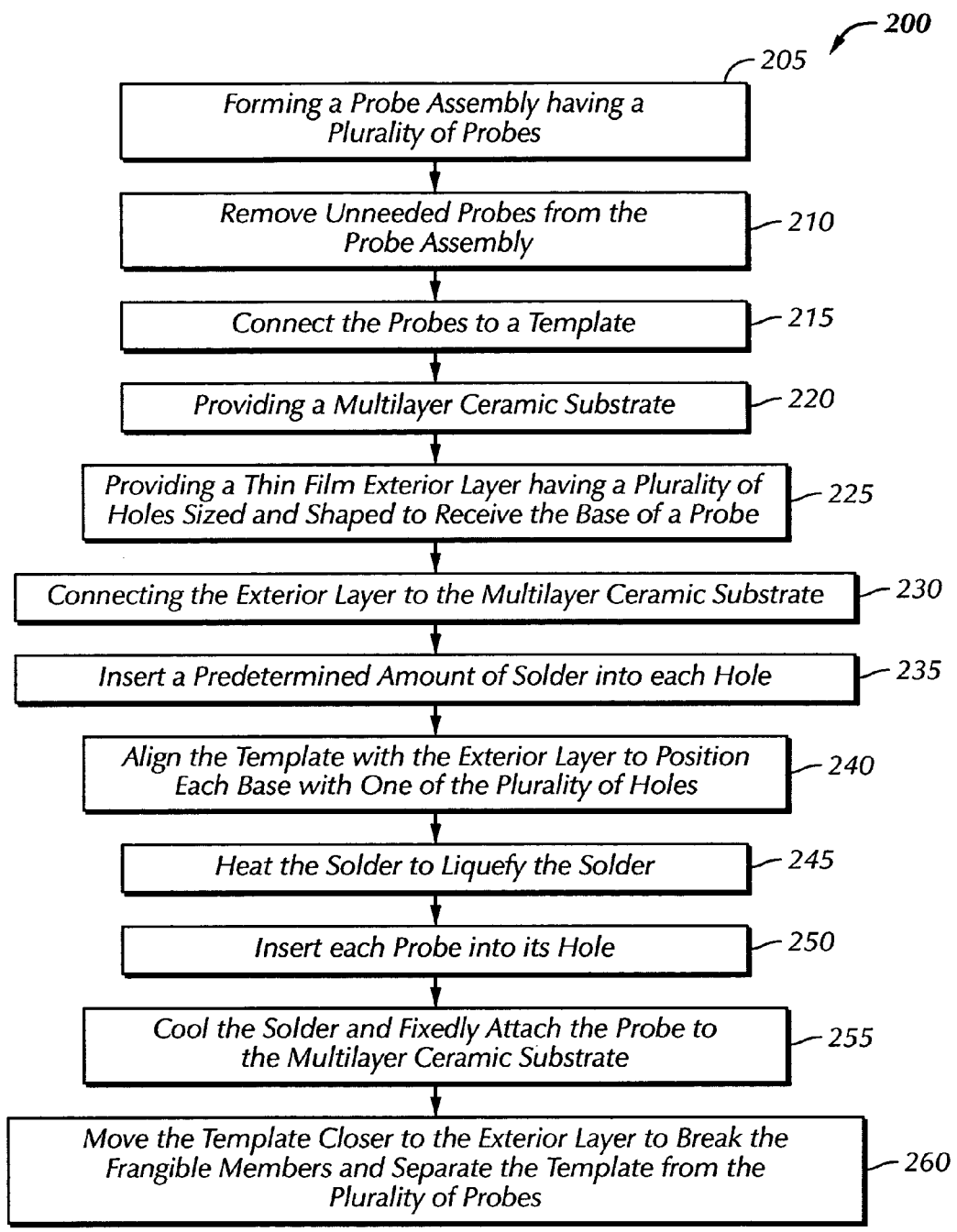
FIG. 11 is a flow diagram illustrating another method of attaching probes to a probe card in accordance with another exemplary embodiment of the present invention.

With reference to FIGS. 2-8 and 11, and according to another exemplary embodiment of the present invention, the probes 20 may be attached to a remainder of the probe card assembly 10 using a method 200 (see FIG. 11). The probe assembly 40 is fabricated, for example, using conventional photolithographic, electroforming, or etching techniques to form the plurality of probes 20 connected to the continuous strip 42 by the frangible members 46 (step 205) (see FIG. 2). The probe card 10 may not require all of the probes provided by the probe assembly 40. Depending upon what probes 20 are required, unneeded probes 20 may be removed from the probe assembly 40, along with the alignment members 44 corresponding to the unneeded probes (step 210) (see FIG. 3). The probes 20 are then connected to the template 50 (step 215), with the alignment members 44 being installed in the template receptacles 56 to connect the continuous strip 42 to the template exterior layer 52 (see FIG. 4). For example, the probes 20 are adhesively connected to the template 50.

The multilayer ceramic substrate 32 is provided (step 220) and the exterior layer 34 is also provided (step 225). The exterior layer 34 is connected to the multilayer ceramic substrate 32 to form a multilayer ceramic assembly 30 (step 230) (see FIG. 5). A predetermined amount of solder 60 is placed into each preformed hole 36 in the exterior layer 34 which is to receive a probe base 24 (step 235) (see FIG. 7). The template 50 is aligned with the exterior layer 34 of the multilayer ceramic assembly 30 to position each base 24 of the plurality of probes 20 at least partially within one of the plurality of holes 36 (step 240) (see FIG. 6).

The solder 60 is heated to a temperature sufficient to liquefy the solder (step 245). For example, the solder 60 is eutectic Pb37Sn63 (or Sn96Ag4), and is heated to a temperature of, for example, 200 (or 220) degrees C. With the solder 60 liquefied, each probe base 24 may be further or fully inserted into the hole 36 in which the base 24 is received (step 250) (see FIG. 8). The amount of solder may be selected, for example, such that when the probe base 24 is inserted (e.g., fully inserted) into the hole 36, the solder 60 and probe base 24 combine to fill (or substantially fill) the volume of the hole 36, without overflowing.

The solder 60 is cooled to solidify the solder into a solder connection 62, fixedly attaching each probe 20 to the multilayer ceramic assembly 30 (step 255). The template 50 is moved closer to the multilayer ceramic assembly 30 to flex the plurality of probes and break the frangible members 46 between the strip 42 and the probes 20, thus separating the template 50 from the plurality of probes 20 (step 260) (see FIG. 9).

The above description relates to a novel probe card assembly 10 and associated methods 100, 200 of attaching probes 20 to a remainder of the probe card assembly which facilitates achieving proper alignment and planarity of the probe tips 22, in accordance with various exemplary embodiments of the present invention. Various features of the probe card assembly, or steps of the methods 100 and 200, may be changed or deleted within the scope of the present invention. Further, the order of the steps of methods 100 and 200 may be changed from the order illustrated in FIGS. 10-11.

Although the present invention has been described primarily in terms of a probe assembly configured to be included in a probe card assembly by inserting a base portion of each probe into an aperture of a substrate, it is not limited thereto. For example, the base of the probes of the probe assembly may be in electrical contact with (e.g., through soldering or other connection methods) a surface electrical contact of the substrate (e.g., a contact pad of the substrate), and not inserted into an aperture.

Although the invention has been described and illustrated with respect to exemplary embodiments thereof, it should be understood by those skilled in the art that the foregoing and various other changes, omissions and additions may be made therein and thereto, without parting from the spirit and scope of the present invention.

What is claimed is:

1. A probe card assembly, comprising:
a substrate layer defining a plurality of apertures;
a plurality of probes, each probe having a base and a tip, wherein the base of each probe is configured to be at least partially inserted within one of the plurality of apertures;
a strip for holding the plurality of probes, the strip being detachably connected to each tip of each probe of the plurality of probes, the strip being configured to transfer and position the base of each of the plurality of probes at least partially into the plurality of apertures prior to the strip being detached from the plurality of probes; and
a template configured to hold the strip during the transfer of the base of each of the plurality of probes, the strip comprising a plurality of alignment members and the template comprising a plurality of receptacles, each of the plurality of receptacles being sized and shaped to receive a corresponding one of the alignment members.

2. The probe card assembly of claim 1, wherein the substrate layer is a thin film layer.

3. The probe card assembly of claim 1, wherein the substrate layer comprises a polyimide material.

4. The probe card assembly of claim 1, further comprising a space transformer, said substrate layer being configured to be connected to the space transformer.

5. The probe card assembly of claim 4, wherein at least a portion of the apertures are aligned above respective conductive regions of the space transformer when the substrate layer is connected to the space transformer.

6. The probe card assembly of claim 4, further comprising an underlying layer between the space transformer and the substrate layer, said underlying layer comprising polyimide.

7. The probe card assembly of claim 1, wherein the base of each probe is configured to be connected to the substrate layer at a corresponding aperture thereof using a solder connection.

8. The probe card assembly of claim 1, wherein the plurality of probes and the strip are photolithographically produced as a single component.

9. The probe card assembly of claim 1, wherein each of the plurality of probes are detachably connected to the strip to enable the strip to be detached from the plurality of probes by flexing the plurality of probes.

10. The probe card assembly of claim 1, wherein each of the plurality of apertures is a conductive via hole.

11. The probe card assembly of claim 1, wherein each of the plurality of apertures extends partially into but not through the substrate layer.

12. A method to attach a plurality of probes to a probe card assembly, comprising:
holding the plurality of probes in a strip, each probe having a base and a tip, wherein the base of each probe is configured to be at least partially inserted within one of a plurality of apertures defined by a substrate layer, the strip being detachably connected to each tip of each probe of the plurality of probes, the strip being configured to transfer and position the base of each of the plurality of probes at least partially into the plurality of apertures prior to the strip being detached from the plurality of probes;
positioning the strip in a template configured to hold the strip during the transfer of the base of each of the plurality of probes, the strip comprising a plurality of alignment members and the template comprising a plurality of receptacles, each of the plurality of receptacles being sized and shaped to receive a corresponding one of the alignment members; and
attaching the plurality of probes into the apertures of the substrate layer.

13. The method of claim 12, wherein the substrate layer is a thin film layer.

14. The method of claim 12, wherein the substrate layer comprises a polyimide material.

15. The method of claim 12, further comprising connecting a space transformer to the said substrate layer.

16. The method of claim 15, wherein at least a portion of the apertures are aligned above respective conductive regions of the space transformer when the substrate layer is connected to the space transformer.

17. The method of claim 15, further comprising positioning an underlying layer between the space transformer and the substrate layer, said underlying layer comprising polyimide.

18. The method of claim 12, wherein the base of each probe is configured to be connected to the substrate layer at a corresponding aperture thereof using a solder connection.

19. The method of claim 12, wherein the plurality of probes and the strip are photolithographically produced as a single component.

20. The method of claim 12, wherein each of the plurality of probes are detachably connected to the strip to enable the strip to be detached from the plurality of probes by flexing the plurality of probes.

21. The method of claim 12, wherein each of the plurality of apertures is a conductive via hole.

22. The method of claim 12, wherein each of the plurality of apertures extends partially into but not through the substrate layer.

* * * * *